(12) United States Patent
Lang et al.

(10) Patent No.: US 11,441,942 B2
(45) Date of Patent: Sep. 13, 2022

(54) PHOTORESIST SPECTRAL SENSITIVITY MATCHING RADIOMETER FOR TRACE/SPACE WIDTH VARIATION IMPROVEMENT

(71) Applicant: Hutchinson Technology Incorporated, Hutchinson, MN (US)

(72) Inventors: Matthew S. Lang, Excelsior, MN (US); Lawrence E. LaLonde, Lakeland, MN (US); Kyle T. Tobias, Eleva, WI (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 527 days.

(21) Appl. No.: 16/446,506

(22) Filed: Jun. 19, 2019

(65) Prior Publication Data

US 2019/0391007 A1     Dec. 26, 2019

Related U.S. Application Data

(60) Provisional application No. 62/689,712, filed on Jun. 25, 2018.

(51) Int. Cl.
| | | |
|---|---|---|
| *G01J 1/04* | (2006.01) | |
| *G02B 5/02* | (2006.01) | |
| *G02B 5/20* | (2006.01) | |
| *G01J 1/16* | (2006.01) | |
| *G03F 7/20* | (2006.01) | |

(52) U.S. Cl.
CPC .......... *G01J 1/0474* (2013.01); *G01J 1/0488* (2013.01); *G01J 1/16* (2013.01); *G02B 5/0205* (2013.01); *G02B 5/208* (2013.01); *G03F 7/70591* (2013.01)

(58) Field of Classification Search
CPC .............. G03F 7/7065; G03F 7/70625; G03F 7/70616; G03F 7/70591; G02B 5/208; G02B 5/0278; G02B 5/0273; G02B 5/0247; G02B 5/0242; G02B 5/0236; G02B 5/0231; G02B 5/0226; G02B 5/0221; G02B 5/0215; G02B 5/021; G02B 5/0205; G01J 1/18; G01J 1/16; G01J 1/0488; G01J 1/0474
See application file for complete search history.

(56) References Cited

U.S. PATENT DOCUMENTS

| | | | | |
|---|---|---|---|---|
| 6,566,656 | B2 * | 5/2003 | May | G01J 1/429 |
| | | | | 250/372 |
| 9,310,298 | B2 * | 4/2016 | Labrie | G01M 11/0235 |
| 2019/0391007 | A1 * | 12/2019 | Lang | G01J 1/0474 |

* cited by examiner

*Primary Examiner* — John R Lee
(74) *Attorney, Agent, or Firm* — DLA Piper LLP (US)

(57) ABSTRACT

A radiometer probe for matching a spectral sensitivity of a dry-film resist is provided. The radiometer probe includes a light probe and a filter-diffuser assembly connected to the light probe. The filter-diffuser assembly includes a filter housing configured to receive an optical diffuser positioned on a filter. The optical diffuser and the filter are separated by a spacer.

20 Claims, 6 Drawing Sheets

PHOTORESIST SPECTRAL SENSITIVITY MATCHING RADIOMETER FOR TRACE/SPACE WIDTH VARIATION IMPROVEMENT

CROSS-REFERENCE TO RELATED APPLICATIONS

This application claims priority from U.S. Provisional Patent Application No. 62/689,712, filed on Jun. 25, 2018, which is hereby incorporated by reference in its entirety.

FIELD

Embodiments generally relate to a radiometer probe configured to match the spectral sensitivity of a dry film resist. Furthermore, embodiments generally relate to calibrating the radiometer probe to the sensitivity of a photoresist.

BACKGROUND

Photoresist compositions are used in microlithography processes for making miniaturized electronic components such as in the fabrication of flexible circuits, printed circuits, computer chips, and integrated circuits. Generally, in these processes, a thin coating of a photoresist composition is first applied to a substrate material. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of devices has led to the use of new photoresists that are sensitive to lower and lower wavelengths of radiation and has also led to the use of sophisticated multilevel systems to overcome difficulties associated with such miniaturization. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

The smaller dimensions of the structures formed using the photo resist compositions can increase the structures being more sensitive to any variations in the dimensions of the formed structures. Thus, there exists a need to reduce the variations in the formed structures.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

A radiometer probe for matching a spectral sensitivity of a dry-film resist and related methods are provided. The radiometer probe includes a light probe and a filter-diffuser assembly connected to the light probe. The filter-diffuser assembly includes a filter housing configured to receive an optical diffuser positioned on a filter. The optical diffuser and the filter are separated by a spacer.

In some embodiments of the disclosure, the light probe includes an international light probe. Furthermore, the optical diffuser can include a quartz cosine diffuser configured to attenuate the intensity of an exposer to be within a targeted liner range. In some embodiments, the optical diffuser includes opaline glass, Polytetrafluoroethylene (PTFE) or Spectralon that couple to fibers and spectrometers to collect signal from 180° field of view. In some embodiments of the disclosure, the optical diffuser includes a top side and an opposing underside. The top side of the optical diffuser can include an etched depression.

In some embodiments of the radiometer probe, the optical diffuser is fixed within the filter housing with the etched depression opposing the filter and spacer. In some embodiments, the filter includes a metallic coating on a first side and a dielectric coating on an opposing second side. Furthermore, the filter can include a metallic coating on a first side and a dielectric coating on an opposing second side. In some embodiments, the filter can be configured to target a linear range with a transmission value of at least one of: 100% at a 365 nm wavelength, 40% at a 405 nm wavelength, or 7% at a 435 nm wavelength.

In some embodiments of the radiometer probe, the filter can be positioned within the filter housing such that the dielectric coating is facing opposite the optical diffuser and the spacer. In some embodiments, the spacer can include a Teflon® shim configured to prevent interference caused by an air gap between the light probe and the filter. In an alternative embodiment, the spacer can include a PTFE shim configured to prevent interference caused by an air gap between the light probe and the filter. In some embodiments, the filter-diffuser assembly can be connected to the light probe via a thread using a threadlocking adhesive.

A method for calibrating a radiometer probe can also be provided herein. The method can include implementing a radiometer probe. The radiometer probe can include a light probe and a filter-diffuser assembly threaded onto the light probe. The filter-diffuser assembly can include a filter housing configured to receive an optical diffuser positioned on a filter. Furthermore, the optical diffuser and the filter can be separated by a spacer. The method can also include implementing a light source. The light source can include an LED light source operating at 365 nm. The method can also include placing the radiometer probe under the light source and measuring an irradiance. The irradiance can be compared with a stored gold standard irradiance. Based on the comparison, the method can also include calibrating the radiometer probe based on the compared measured irradiance with the stored gold standard irradiance.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope. The principles are described and explained with additional specificity and detail through the use of the following drawings.

DETAILED DESCRIPTION

Figure 1A:
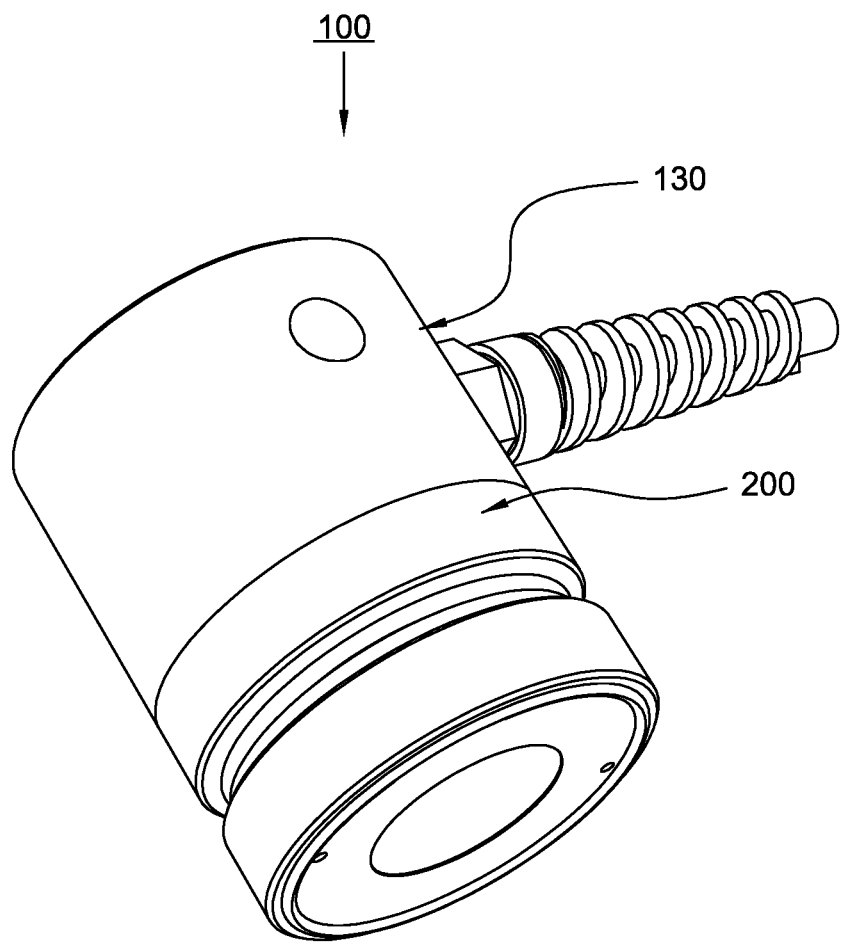
FIG. 1A exemplifies a radiometer probe, in accordance with an embodiment of the disclosure.

Embodiments of the present invention are described with reference to the attached figures, wherein like reference numerals are used throughout the figures to designate similar or equivalent elements. The figures are not drawn to scale, and they are provided merely to illustrate the embodiments of the invention. Several aspects of the embodiments of the invention are described below with reference to example applications for illustration. It should be understood that numerous specific details, relationships, and methods are set forth to provide a full understanding of embodiments of the invention. One having ordinary skill in the relevant art, however, will readily recognize that embodiments of the invention can be practiced without one or more of the specific details, or with other methods. In other instances, well-known structures or operations are not shown in detail to avoid obscuring embodiments of the invention. Embodiments of the present invention are not limited by the illustrated ordering of acts or events, as some acts may occur in different orders and/or concurrently with other acts or events. Furthermore, not all illustrated acts or events are required to implement a methodology in accordance with embodiments of the present invention.

Radiometers and their application to photoresist are typically used for lithography with broad-band sources. For example, a broad-band source such as a typical mercury bulb can include spectral peak outputs at 365 nm, 405 nm and 435 nm. The intensity of these spectral peaks can shift from bulb to bulb and with bulb age. Thus, problems arise when a technician is attempting to stabilize the dose delivered to a photoresist.

Some lithography processes can be used with a narrow-band or single-band radiometers. For example, a radiometer probes can be configured to be sensitive to only i-line (365 nm) radiation. Because the photoresist may be sensitive to wavelengths outside the i-line radiation, the radiometer probe tuned to the i-line radiation cannot properly calibrate shutter time between machines.

In the case of using radiometers with broad-band sources, the spectral sensitivity of the radiometer could be narrower than the broad-band sources spectral emission. However, using these radiometers in lithography with a broad-band source with a photoresist could result in undesired effects, since the spectral sensitivity of a dry-film photoresist is likely wider than the radiometer used in lithography. Thus, variations in the process occur and can prevent producing product within a desired range of tolerance. As a result, there exists a need to modify the radiometer probe to match the sensitivity of the dry-film resist. Furthermore, there exists a need to modify the radiometer probe to reduce the variations between exposer with the same dose parameters.

Embodiments of the present disclosure provide a radiometer probe, which includes a light probe and a filter-diffuser assembly. The filter-diffuser assembly can include an optical diffuser, a filter, a spacer and a filter housing. The radiometer probe can be configured to match a photoresist sensitivity across multiple wavelengths. This provides a probe that is better match to the sensitivity of the photoresist, which enables more consistent results in the dimensions of the patterned photoresist.

FIG. 1A exemplifies a radiometer probe 100 as disclosed herein. As indicated above, the radiometer probe 100 is configured to reduce variation in the patterned photoresist that receive the same expose dose. The radiometer probe 100 can include a light probe 130 and a filter-diffuser assembly 200. In some embodiments, the light probe 130 can include a light probe manufactured by International Light Technologies. For some embodiments, the filter-diffuser assembly 200 is configured to be threaded onto the light probe 130. This is described in more detail further below.

Figure 1B:
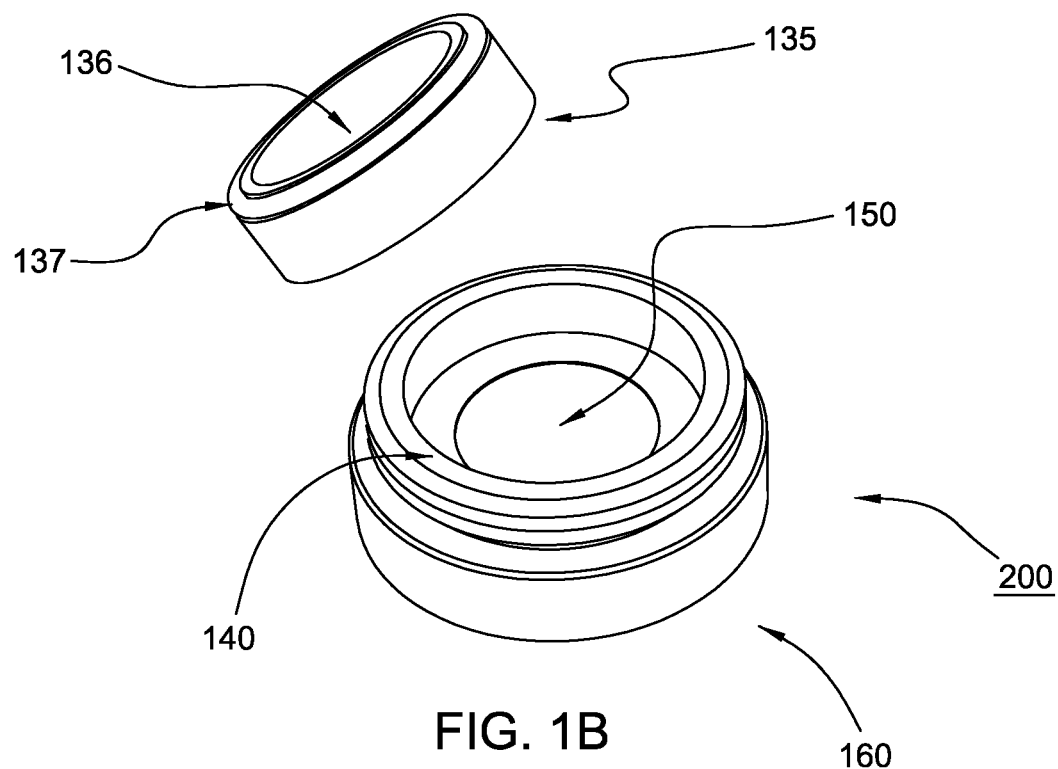
FIG. 1B exemplifies a filter-diffuser assembly of the radiometer probe of FIG. 1A, in accordance with an embodiment of the disclosure.

FIG. 1B exemplifies a filter-diffuser assembly 200 as disclosed herein. The filter-diffuser assembly 200 can include an optical diffuser 135, a filter 150, a spacer 140, and a filter housing 160. For some embodiments, the optical diffuser 135 can include a quartz cosine diffuser. A cosine corrector is an optical diffuser (e.g., opaline glass, Polytetrafluoroethylene (PTFE) or Spectralon) that couple to fibers and spectrometers to collect light from 180° field of view. The optical diffuser 135 can include a top side and an opposing underside. The top side of the optical diffuser 135 can include an etched depression 136. Further, a sealing ring 137, according to some embodiments, is configured to be disposed between the optical diffuser 135 and the light probe 130. The optical diffuser 135 can be configured to attenuate the intensity of an exposer to be within a targeted liner range.

In some embodiments of the disclosure, the filter 150 can be a thin film manufactured by Ocean Thin Films. For some embodiments, the filter 150 can have a metallic coating on a first side and a dielectric coating on an opposing second side. The response of the filter is configured by using one or more metallic coatings on one side and one or more dielectric coating on the other side, according to some embodiments. However, other embodiments include using any of one or more metallic coatings and one or more dielectrics on one or both sides of the filter such the sum of the response of each metallic coating and/or each dielectric sum to a desired response for the filter. Moreover, the filter 150 can be configured to have a desired wavelength response based on the one or more wavelength sensitivities for a particular photoresist. For example, the filter is configured to transmit: 100% at a 365 nm wavelength, 40% at a 405 nm wavelength, or 7% at a 435 nm wavelength.

When assembled within the filter-diffuser assembly 200, the dielectric coating of the filter 150 can face out with the metallic coating facing the optical diffuser 135, according to some embodiments. The filter-diffuser assembly 200 can also include a filter housing 160. The filter 150 can be placed into the filter housing 160 dielectric side down. A spacer 140 can be placed on the metallic side of the filter 150. In some embodiments, the spacer 140 can include a Teflon® shim. In other embodiments, the spacer 140 can include a PTFE shim or spacer. The spacer 140 can be incorporated to prevent interference caused by an air gap between the light probe 130 and the filter 150.

The optical diffuser 135 can be fixed into the filter housing 160. Specifically, the optical diffuser 135 can be fixed onto the spacer 140. Subsequently, the optical diffuser 135 is fixed on the metallic side of the filter 150, separated by the spacer 140. The optical diffuser 135 can be fixed into the filter housing 160 with the etched depression 136 and sealing ring 137 facing up. In other words, the optical diffuser 135 can be placed into the filter housing 160 where the underside contacts the spacer 140.

Figure 1C:
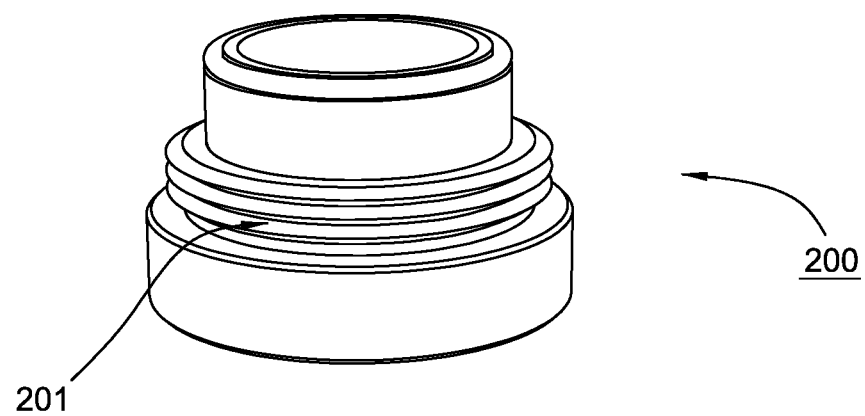
FIG. 1C exemplifies the filter-diffuser assembly of FIG. 1B prior to being threaded onto the light probe, in accordance with an embodiment of the disclosure.

Referring momentarily to FIG. 1C, once the filter-diffuser assembly 200 is assembled, the filter-diffuser assembly 200 can be threaded onto the light probe (not shown) to create the radiometer probe 100. The filter-diffuser assembly 200 can be fixed to the light probe 130 using a threadlocking adhesive 201. For example, LOCTITE® 242, a medium strength, medium viscosity thixotropic threadlocking adhesive, can be implemented to secure the two parts.

Figure 1D:
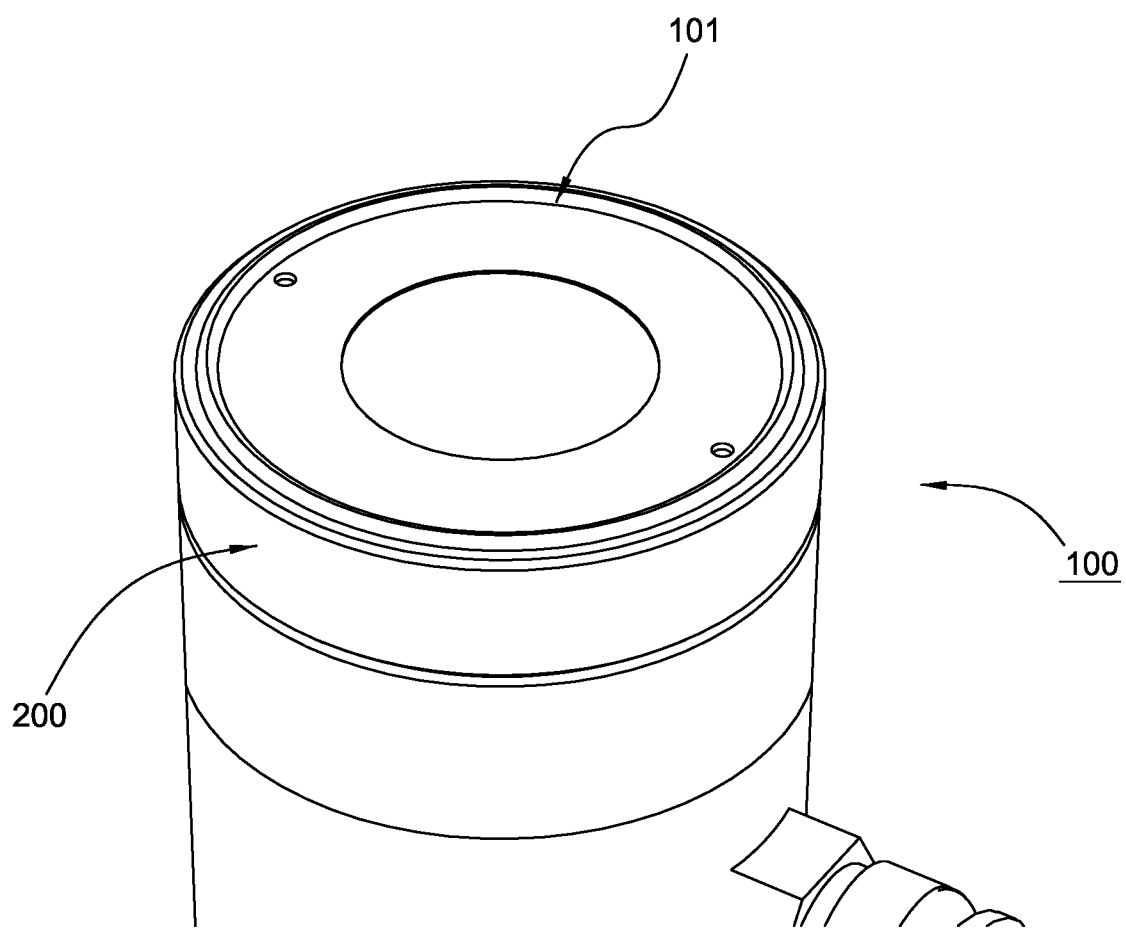
FIG. 1D exemplifies a mechanical gasket being fixed to the filter-diffuser assembly of FIG. 1B, in accordance with an embodiment of the disclosure.

Referring momentarily to FIG. 1D, once the radiometer probe 100 is assembled, a mechanical gasket 101 can be attached at the filter-diffuser assembly 200. The mechanical gasket 101 can be a loop of elastomer with a round cross-section, designed to be seated in a groove of the filter-diffuser assembly 200 and compressed during assembly between two or more parts, creating a seal at the interface.

Figure 1E:
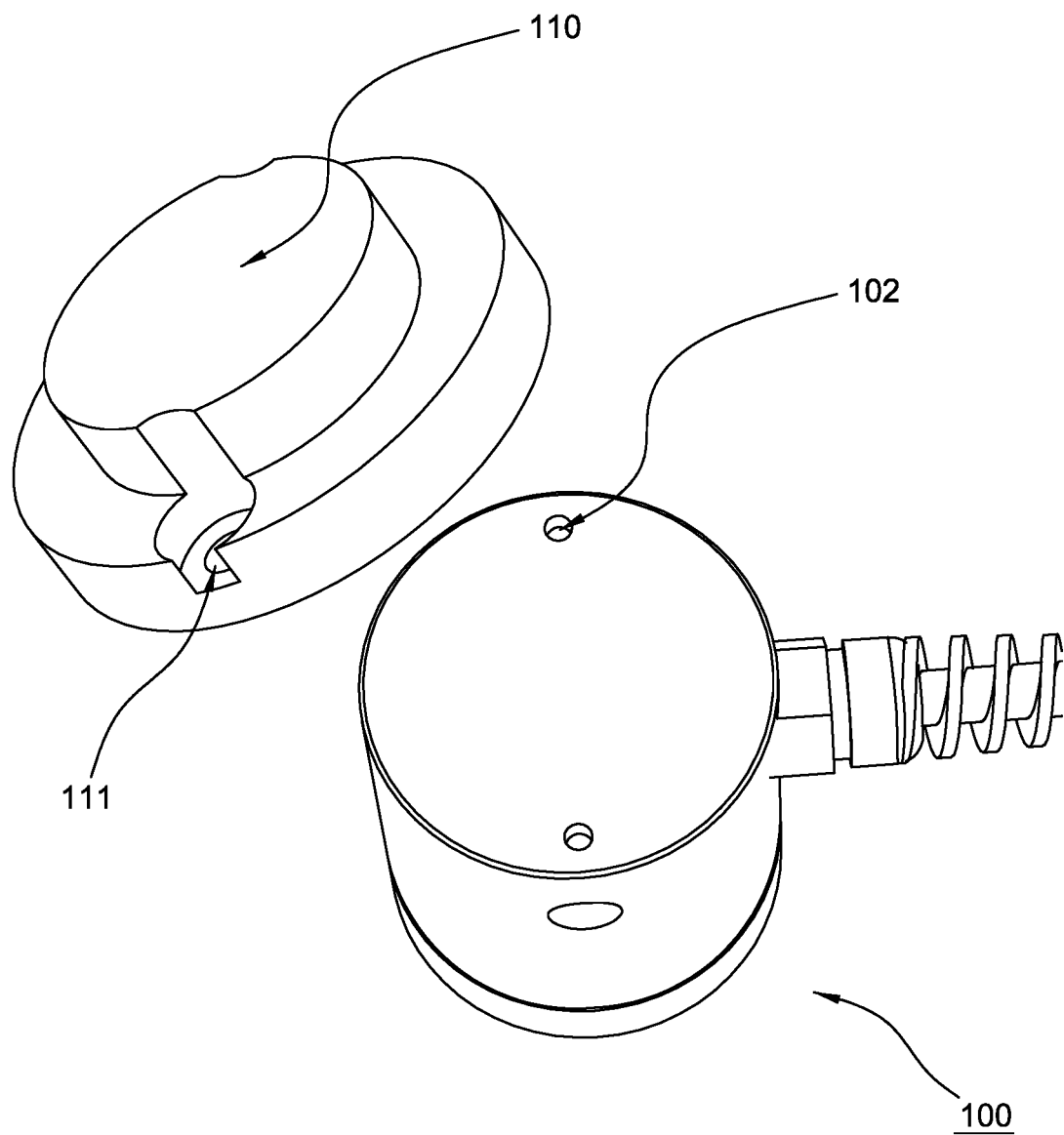
FIG. 1E exemplifies a stainless steel (SST) weight being fixed to the radiometer probe, in accordance with an embodiment of the disclosure.

Referring momentarily to FIG. 1E, a stainless steel (SST) weight 110 can be assembled on the radiometer probe 100 at the light probe 130. The SST weight 110 can have a plurality of apertures 111. Moreover, the light probe 130 can include a threaded receiving element 102. A plurality of bolts can be implemented through the apertures 111 of the SST weight 110 into the threaded receiving element 102 of the light probe 130.

By implementing the filter-diffuser assembly 200, the radiometer probe 100 can enable tighter absolute dose control over differing bulbs and over the life span of a given bulb. This allows better dimension control over the patterned photoresist which results in less variation in the dimensions of the final product. For example, the dimensions of circuit traces formed on a circuit board or flexure using photoresist patterned using an exposer with a radiometer probe tuned to the wavelength sensitivities of the photoresist used to form the circuit traces results in circuit traces with lower variations across batches. Thus, impedance characteristics and other performance specifications are held within a tighter range than those formed using other techniques. For example, an exposer with a radiometer probe tuned to the wavelength sensitivities of the photoresist using techniques including those described herein is configured to pattern photoresist to form at least one set of structures having a space of less than 12 microns between one structure and an adjacent structure of the set. Further, the use of the exposer with a radiometer probe tuned to the wavelength sensitivities of the photoresist enables the use of photoresist to pattern the structures such that the there is no more than about 10% variation in the feature size or a critical dimension of the structures formed using the photoresist.

Figure 2:
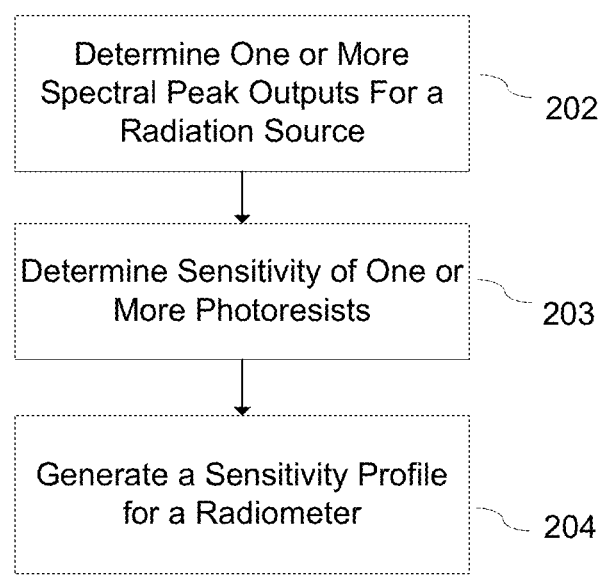
FIG. 2 illustrates a process for determining the wavelength sensitivity of dry films in accordance with an embodiment of the disclosure.

FIG. 2 illustrates a process for determining the wavelength sensitivity of dry films according to an embodiment. A process for determining the wavelength sensitivity of dry films, such as a photoresist, includes determining one or more spectral peak outputs for a radiation source used for an exposer for photo resist (202). For example, the process can use a broad-band spectrometer to detect the peak outputs of the source. Once the peak outputs of the radiation source are known, single wavelength radiation sources, such as single wavelength light-emitting diodes (LED), may be used to determine the sensitivity of one or more photo resists to each of the peak outputs of the radiation source (203). For example, multiple samples of a photo resist are exposed to the single wavelength radiation source such that each sample is exposed to the radiation source for a different dose level over a range of dose levels. For various embodiments, this process is repeated for each of the peak output wavelengths. The lowest dose level where the photo resist did not completely develop away is used to generate a sensitivity profile for a radiometer for each peak output wavelength. For example, the sensitivity profile can be used to configure a filter of a filter-diffuser assembly for a radiometer such as those described herein (204).

Typical mercury bulbs can have an output of 365 nm, 405 nm and 435 nm. As the bulb ages the 365 nm degrades faster than the 405 nm. In the event the exposer is only being calibrated at the 365 nm peak, the photo resist will become overexposed as the bulb ages. This is because the photo resist is still sensitive to the 405 nm exposer. However, using a radiometer probe with a filter configured for a sensitivity profile for the photoresist being exposed results in more consistent results over the manufacturing process and across different exposer units.

Figure 3:
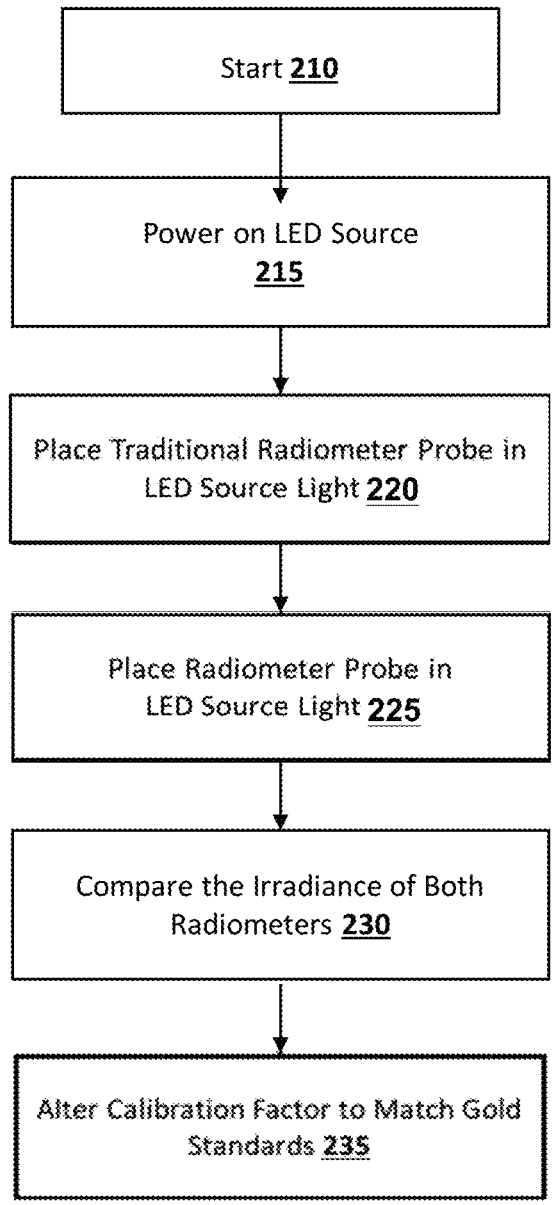
FIG. 3 illustrates a calibration process in accordance with an embodiment of the disclosure for radiometer probe.

FIG. 3 illustrates a process for calibrating a radiometer probe to give accurate radiometric measurements when using a custom filter. According to embodiments describe herein, the traditional radiometer probe is used as a calibration standard to ensure the radiometer probe is properly calibrated for a photoresist. The calibration can be performed using a single wavelength radiation source for each wavelength to be calibrated. Alternatively, the radiometer probe is calibrated using a broad-spectrum radiation source, such as a mercury bulb. At step 210, the process is initiated. A radiation source is used to generate at least one spectral peak output of the radiation source that is used in the lithography process. For example, an LED is used to generate output at a wavelength tuned to at least one spectral peak output the photoresist will be exposed to during the lithography process, such as for example, an output at 365 nm. At step 215, the radiation source, such as an LED source, is powered on. For some embodiments, the LED source is allowed to remain powered on until the LED comes to an equilibrium temperature and provides a stable output. At step 220, the traditional radiometer probe, which is used as the calibration standard, is placed under the LED source and the irradiance is recorded. At step 225, the radiometer probe to be calibrated is placed under the LED source and the irradiance is recorded. At step 230, the irradiance for both the traditional radiometer and the radiometer probe is compared. The calibration factor of the radiometer probe can be altered to match the traditional radiometer or within a range of the traditional radiometer. The process can be used to calibrate the radiometer probe at one or more wavelengths. For some embodiments, the calibration process is performed in a test assembly. For other embodiments, the calibration process is performed in the exposer that the radiometer probe will be used in after calibration.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A radiometer probe for matching a spectral sensitivity of a dry-film resist comprising:
   a light probe; and
   a filter-diffuser assembly connected to the light probe, the filter-diffuser assembly including a filter housing configured to receive an optical diffuser positioned on a filter, the optical diffuser and the filter are separated by a spacer such that the radiometer probe is configured to expose a pattern on the dry-film resist to form at least one set of adjacent structures, having a space of less than 12 microns between one structure and an adjacent structure of the set.

2. The radiometer probe of claim 1, wherein the light probe includes a light probe.

3. The radiometer probe of claim 1, wherein the optical diffuser includes a quartz cosine diffuser configured to attenuate an intensity of an exposer to be within a targeted liner range.

4. The radiometer probe of claim 3, wherein the optical diffuser includes at least one of opaline glass, Polytetrafluoroethylene (PTFE) or Spectralon that couple to fibers and spectrometers to collect signal from 180° field of view.

5. The radiometer probe of claim 1, wherein the optical diffuser includes a top side and an opposing underside, wherein the top side of the optical diffuser includes an etched depression.

6. The radiometer probe of claim 5, wherein the optical diffuser is fixed within the filter housing with the etched depression opposing the filter and spacer.

7. The radiometer probe of claim 1, wherein the filter includes a metallic coating on a first side and a dielectric coating on an opposing second side.

8. The radiometer probe of claim 1, wherein the filter is configured to target a linear range with a transmission value of at least one of: 100% at a 365 nm wavelength, 40% at a 405 nm wavelength, or 7% at a 435 nm wavelength.

9. The radiometer probe of claim 1, wherein the filter is positioned within the filter housing such that a dielectric coating is facing opposite the optical diffuser and the spacer.

10. The radiometer probe of claim 1, wherein the spacer includes a Teflon® shim configured to prevent interference caused by an air gap between the light probe and the filter.

11. The radiometer probe of claim 1, wherein the spacer includes a PTFE shim configured to prevent interference caused by an air gap between the light probe and the filter.

12. The radiometer probe of claim 1, wherein the filter-diffuser assembly is connected to the light probe via a thread using a threadlocking adhesive.

13. A method for calibrating a radiometer probe, the method comprising:
   implementing the radiometer probe including a light probe and a filter-diffuser assembly threaded onto the light probe, the filter-diffuser assembly including a filter housing configured to receive an optical diffuser positioned on a filter, wherein the optical diffuser and the filter are separated by a spacer;
   implementing a light source;
   placing the radiometer probe under the light source and measuring an irradiance; comparing the measured irradiance with a standard irradiance; and
   calibrating the radiometer probe based on the compared measured irradiance with the standard irradiance such that the radiometer probe is configured to expose a pattern on a dry-film resist to form at least one set of adjacent structures, having a space of less than 12 microns between one structure and an adjacent structure of the set.

14. The method of claim 13, wherein the light probe includes a light probe.

15. The method of claim 13, wherein the optical diffuser includes a quartz cosine diffuser configured to attenuate a intensity of an exposer to be within a targeted liner range.

16. The method of claim 15, wherein the optical diffuser includes at least one of opaline glass, Polytetrafluoroethylene (PTFE) or Spectralon that couple to fibers and spectrometers to collect signal from 180° field of view.

17. The method of claim 13, wherein the optical diffuser includes a top side and an opposing underside, wherein the top side of the optical diffuser includes an etched depression.

18. The method of claim 17, wherein the optical diffuser is fixed within the filter housing with the etched depression opposing the filter and spacer.

19. The method of claim 13, wherein the filter includes a metallic coating on a first side and a dielectric coating on an opposing second side.

20. The method of claim 13, wherein the filter includes a metallic coating on a first side.

* * * * *